US006543361B2

(12) United States Patent
Schmid

(10) Patent No.: US 6,543,361 B2
(45) Date of Patent: Apr. 8, 2003

(54) METHOD OF INCREASING THE SERVICE LIFE OF PRINTING FORMS WHEREON IMAGES CAN BE SET IN PRINTING MACHINES

(75) Inventor: Gotthard Schmid, Malsch (DE)

(73) Assignee: Heidelberger Druckmaschinen AG, Heidelberg (DE)

( * ) Notice: Subject to any disclaimer, the term of this patent is extended or adjusted under 35 U.S.C. 154(b) by 0 days.

(21) Appl. No.: 09/792,795

(22) Filed: Feb. 23, 2001

(65) Prior Publication Data

US 2001/0026296 A1 Oct. 4, 2001

(30) Foreign Application Priority Data

Feb. 23, 2000 (DE) ........................................ 100 08 416

(51) Int. Cl.[7] .............................. B41C 1/10; G03F 7/40
(52) U.S. Cl. ........................ 101/467; 430/309; 430/328
(58) Field of Search .............................. 101/456, 463.1, 101/465, 466, 467; 430/302, 309, 328, 330; 347/185

(56) References Cited

U.S. PATENT DOCUMENTS 3,836,709 A * 9/1974 Hutchison ................... 101/467
5,713,287 A 2/1998 Gelbart ....................... 101/467
6,030,750 A * 2/2000 Vermeersch et al. ........ 101/467
6,214,515 B1 * 4/2001 Van Damme et al. ...... 430/302

FOREIGN PATENT DOCUMENTS

DE 196 12 927 A1 11/1996
DE 198 17 756 A1 11/1998
EP 0 771 645 A1 5/1997

OTHER PUBLICATIONS

International Publication WO 99/38688 (Harris et al.), dated Aug. 5, 1999.

* cited by examiner

*Primary Examiner*—Stephen R. Funk
(74) *Attorney, Agent, or Firm*—Laurence A. Greenberg; Werner H. Stemer; Ralph E. Locher

(57) ABSTRACT

A method of treating a process-free printing form fitted to a printing-form cylinder includes having an imaging unit act upon a coating of a printing form and produce printing areas and non-printing areas on the printing form, and after the imaging unit has acted upon the coating, operating the imaging unit at reduced power during a return pass into a starting position thereof.

8 Claims, 2 Drawing Sheets

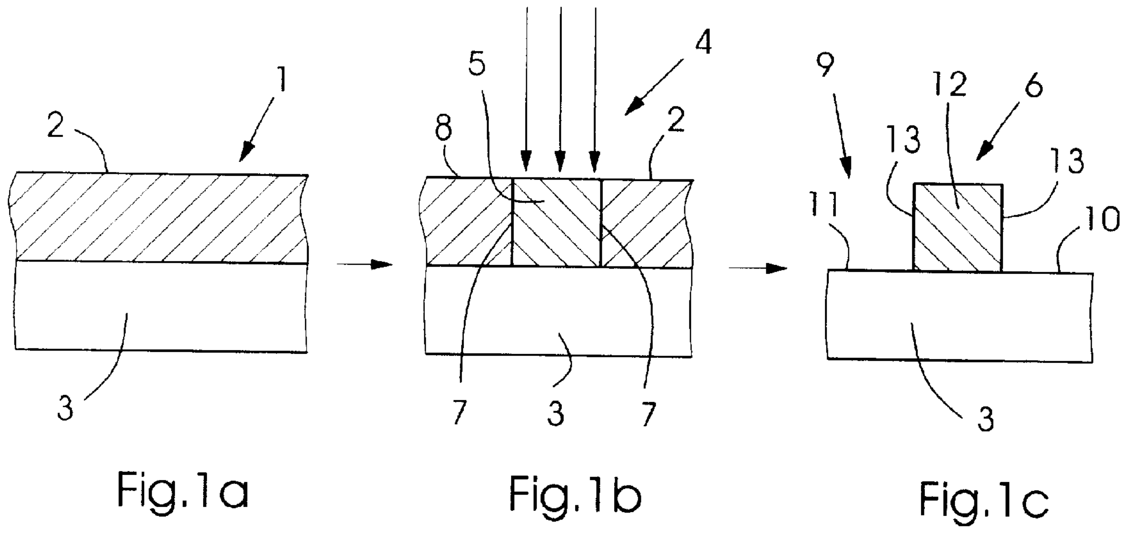
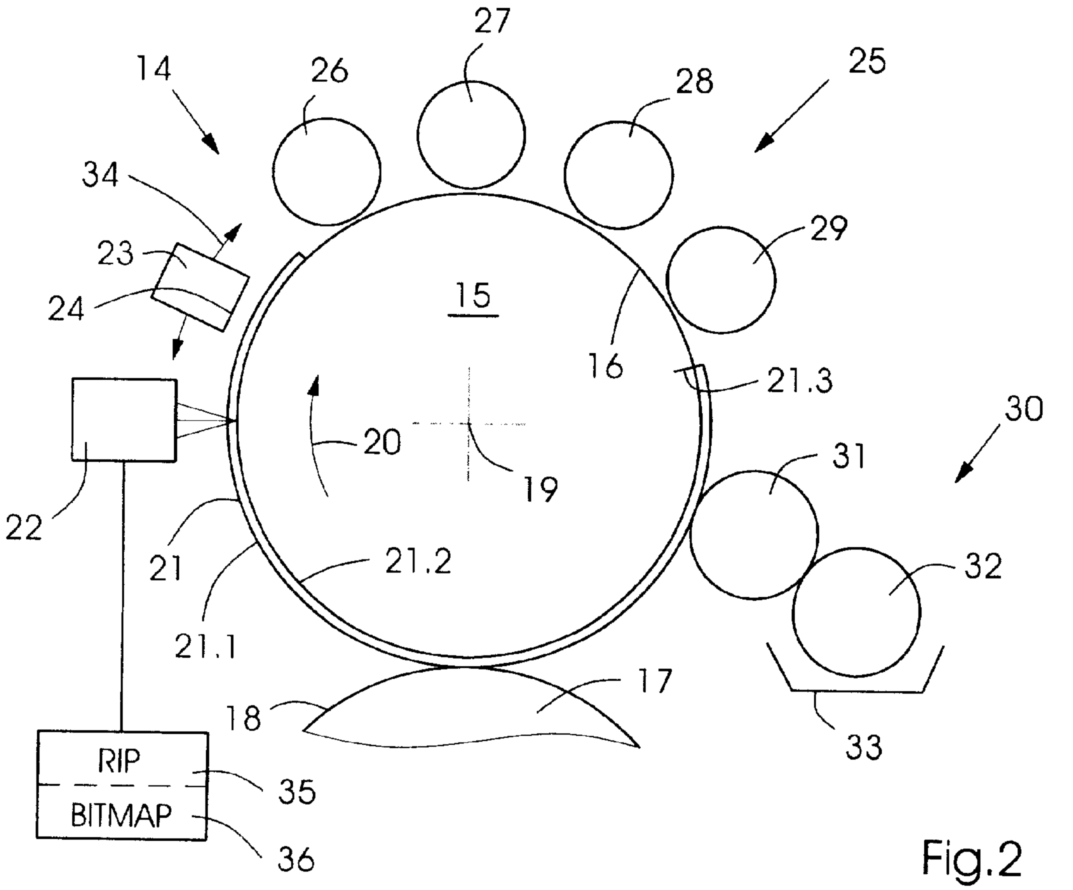
Fig.2

METHOD OF INCREASING THE SERVICE LIFE OF PRINTING FORMS WHEREON IMAGES CAN BE SET IN PRINTING MACHINES

BACKGROUND OF THE INVENTION

Field of the Invention

The invention relates to a method of increasing the service life of printing forms whereon images can be set directly in printing machines, regardless of whether the printing forms whereon images can be set are in plate form or in sleeve form, in particular, printing forms whereon images can be set thermally without any process.

The published non-prosecuted German Patent Application (DE-OS) 196 12 927 A1 is concerned with a printing machine and an imaging or image production method for a printing machine. A printing unit with a seamless image cylinder is provided which, by a direct imaging method is coated within the printing unit with a dryable polymer. After the polymer has been dried, the surface property of the polymer applied to the image cylinder is transformed, completely or in given regions, by selective laser radiation, in order to alter the affinity thereof with respect to a printing ink. The image cylinder is used instead of a plate cylinder in a conventional offset printing machine, and indeed, more specifically in wet offset printing or also in dry offset printing. After printing, the image cylinder is cleaned of the layer provided with an image. In this case, it is unnecessary for the layer to be removed completely and, moreover, the system can be employed in already existing printing machines.

In the case of computer-to-plate or computer-to-press applications, thermal printing plates are employed as printing forms whereon images can be set directly, a distinction being drawn between thermal printing plates for development in the wet process, and process-free thermal printing plates of the second generation.

When plate imaging or setting an image on a plate by thermal detachment of polymers, the non-printing plate segments are detached by heat and subsequently washed out. When plate imaging or setting an image on a plate by thermal crosslinking, partial crosslinking of the printing plate segments by heat occurs, and at the non-printing locations, the unchanged polymers are washed out.

Total crosslinking of the printing plate segments or partial crosslinking, if necessary or desirable, of the non-printing plate segments which may occur is achieved in a preheating phase, for example, by the application of infrared radiation.

In a further known plate image setting or imaging process by a thermal masking method, a mask layer over the printing plate segments is cured thermally. The mask layer over the non-printing plate segments is then washed out before, in a further process step, post-exposure to floodlights destroys those plate segments which are not protected by the mask. The mask layer remaining located over the printing plate segments is washed out afterwards.

In the case of these thermal printing plates, various process steps are accordingly necessary for the development of the print-ready printing forms and, in the case of a job change, have to be run through, and naturally take time.

By comparison, process-free thermal printing plates constitute a further development. These may have an image set thereon by a process involving thermal ablation of the printing segments. By a laser, the printing image is burned into a central multilayer structure forming the image. The washing water dissolves the imaged segments together with the covering layer when the printing machine is started up; the soapy layer thereof is transferred via the rubber blanket to the first feed sheets.

According to a further process for plate imaging or setting an image on a plate by thermal transfer of the printing segments, an ink-accepting carbon layer is transferred by heat from a carrier film to the plate. In a second process step which is necessary in this process, outside the "computer-to-plate" system, the segments whereon no image has been set are pulled off the plate, together with a carrier film. The plate image setting or imaging processes for process-free printing plates remain to some extent at the laboratory stage. In the case of process-free printing forms, the service life or durability has previously been limited merely to edition levels of about 30,000 prints, and after this time, the process-free thermal printing plates generally have to be interchanged and replaced by new printing plates.

Powder, paper dust and other dirt particles, which can penetrate into the printing machine in the printing hall in the widest possible range of ways, to some extent result in minor damage to the ink-carrying layer even after a short time, and the damage becomes visible in the print. In individual cases, the phenomenon occurs wherein the applied damage becomes continuously greater in the course of printing an edition.

In current applications of thermal process-free printing forms, the service life or durability of the printing form whereon an image can be set directly in the printing machine is determined by the external action of particles such as dirt, dust grains, paper dust, powder or particles from plate fabrication or plate packaging. The process-free printing forms do not exhibit the service life or durability of a conventional or a burned-in processed printing form.

Heretofore, attempts have been made to increase the service life of conventional printing forms by burning-in the upper sides of printing forms finished in this way. The burning-in was performed outside the printing machine. If processed printing forms are used as printing forms whereon images can be set directly, prolongation of the service life of the printing forms whereon images can be set can be achieved by effecting the development and burning-in outside the rotary system, after image setting or imaging has been performed on a plate exposure unit. In order to burn-in the plates, an additional operation outside the printing unit is required following the image setting or imaging. The additional handling which is required in this manner for a printing form whereon an image has already been set intrinsically carries with it risks of damage to the surface of the printing form whereon an image has already been set and makes no sense in computer-to-press operation because the plates would have to be unclamped.

SUMMARY OF THE INVENTION

Based upon the state of the prior art outlined hereinbefore and the technical problems indicated, it is an object of the invention to provide a method of increasing the service life of printing forms whereon images can be set in printing machines by stabilizing the surface of a printing form whereon an image has been set directly in the printing machine, and of prolonging the service life or durability of the printing form without having to remove from the printing machine the printing form whereon an image can be set directly.

With the foregoing and other objects in view, there is provided, in accordance with a first aspect of the invention, a method of treating a process-free printing form fitted to a printing-form cylinder, which comprises having an imaging unit act upon a coating of a printing form and produce printing areas and non-printing areas on the printing form, and after the imaging unit has acted upon the coating, operating the imaging unit at reduced power during a return pass into a starting position thereof.

In accordance with another mode of the method invention, the reduced power corresponds to the power just needed for fixing the part of the coating whereon the printing areas are produced.

In accordance with a further mode, the method invention includes providing power during the return pass of the imaging unit into the starting position thereof which corresponds to the power required for producing the printing areas on the coating, which are ink carrying areas.

In accordance with an added mode, the method invention includes, during the return pass of the imaging unit, performing renewed imaging on the coating of the printing form in accordance with a bitmap of a raster image processor.

In accordance with an additional mode, the method invention includes preselecting the power of the imaging unit for the respective return pass depending upon the printing form fitted to the printing-form cylinder.

In accordance with yet another mode, the method invention includes preselecting the power of the imaging unit during the return pass depending upon the manufacturer of the printing form whereon an image is to be set.

In accordance with yet a further mode, the method invention includes limiting the maximum speed of the imaging unit during the return pass thereof, when the printing form demands a high power level of the imaging unit.

In accordance with yet an added mode, the method invention includes limiting the stroke of the imaging unit during the return pass of the imaging unit, when the printing form demands a high power level of the imaging unit.

In accordance with another aspect of the invention, there is provided a method of treating a process-free printing form fitted to a printing-form cylinder, which comprises having an imaging unit act upon a coating of a printing form and produce printing areas and non-printing areas on the printing form, and after setting a dampening-solution applicator roller onto the coating of the printing form whereon the imaging unit has set an image, delimiting the non-printing areas from the printing areas, and then performing a second imaging operation with the imaging unit.

In accordance with a further mode, the method invention includes performing the second imaging operation with the imaging unit more quickly than the first imaging operation, after activating the printing form.

In accordance with an added mode, the method invention includes, after washing out the printing form between imaging operations in a forward pass and the return pass, setting an image on the printing form by the imaging unit over the entire area of the printing form, depending upon the layer structure of the printing form.

In accordance with a concomitant mode, the method invention includes, after washing out the printing form after the return pass of the imaging unit and a second imaging pass, setting an image on the printing form by the imaging unit over the entire area of the printing form, depending upon the layer structure of the printing form.

The advantages which can be achieved by the method according to the invention are that an imaging or image setting unit already contained in a printing machine, which sets an image directly on the printing form, passes through a return pass, constituting double image setting, into a starting position thereof and, during the return pass, the image setting pattern produced during the forward pass of the imaging or image setting unit is fixed, with no changeover time, and the surface of the printing form whereon an image has been set is therefore stabilized. The return pass into the starting position of the imaging or image setting unit is necessary; it is now possible for this return pass to be utilized to improve the service life or durability of the printing form whereon an image can be set directly. The reduction in the power of the imaging or image setting unit during the return pass can be preselected precisely so that the power just fixes and cures the image setting or imaging pattern produced during the forward pass, as a result of which the pattern becomes more resistant to the influences such as adhering particles, paper dust, powder, and so forth and the pressings which occurs cyclically in the printing nip.

In an advantageous development of the idea upon which the invention is based, after the performance of the imaging or image setting on the coating on the printing form in the forward pass, during the return pass of the imaging or image setting unit, the power thereof can either be limited to the extent needed to cure the coating, or the reduction in the power of the imaging or image setting unit can be controlled during the return pass thereof in accordance with the bitmap, so that during the return pass of the imaging or image setting unit, a second imaging or image setting pass takes place with a power level which is reduced, but in order to cure the coating surface produced in the first pass. If the return pass of the imaging or image setting unit into the respective starting position thereof, normally retracted against a side wall of the printing unit, is utilized to cure the previously image-set surface of the printing form, the set-up and changeover times of the printing machine are not prolonged during a job change, because the return pass of the imaging or image setting unit into the starting position thereof is necessary in any case.

With the process according to the invention, the curing of the image-set printing form surface can be controlled individually; the curing power which has to be applied by the imaging or image setting unit may be directed towards the elevated, projecting, ink-accepting area parts of the coating on the printing form, the reduced power of the imaging or image setting unit striking the ink-accepting and the dampening-solution carrying areas of the printing form.

In addition, the power output by the imaging or image setting unit to the printing form can be preselected, depending upon the make of the printing form applied to the circumference of the printing-form cylinder. Presetting of the emitted laser power of an imaging or image setting unit, depending upon the manufacturer of the printing form used, is also possible within the context of presetting the imaging or image setting parameters on a digitally, directly image set printing machine.

In an advantageous development of the method according to the invention, for stabilizing the image-set printing-form surface in the case of those printing forms, whether plate-shaped or sleeve-shaped printing forms, which have a high energy requirement, the maximum speed of the imaging or image setting unit during the return pass and/or the maximum rotational speed of the printing-form cylinder during the return pass phase of the imaging or image setting unit can be limited, so that it is possible to perform the curing and stabilization of the image-set surfaces even of those printing forms which have a higher energy requirement.

In addition to limiting the maximum speed of the printing-form cylinder during the imaging or image setting phase, the speed of advance of the imaging or image setting unit in the axial direction in conjunction with the corresponding rotational speed of the plate cylinder can also be limited, so that a sufficiently long curing time can be achieved during the return pass of the imaging or image setting unit.

In a further process proposed in accordance with the invention, after the dampening-solution applicator roller has been set onto one of the printing-form surfaces which have just had images newly set on them in a first pass, the elevated printing areas produced by the imaging or image setting unit can be delimited from the non-printing areas and, after a cleaning step has been performed in such a manner, curing of the image-set areas is performed by a renewed pass of the imaging or image setting unit in the axial direction. Because the imaging or image setting pattern has already been applied in accordance with the bitmap deposited in the RIP, the second pass of the imaging or image setting unit following the activation of the printing form by setting the dampening-solution applicator roller on, can proceed significantly more quickly.

Other features which are considered as characteristic for the invention are set forth in the appended claims.

Although the invention is illustrated and described herein as a method of increasing the service life of printing forms whereon images can be set in printing machines, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, wherein:

BRIEF DESCRIPTION OF THE DRAWINGS

FIGS. 1*a* to 1*c* represent greatly simplified, diagrammatic fragmentary sectional views of a process-free printing form, and show the sequence of the imaging or image setting process applied to the process-free printing form;

FIG. 2 is a diagrammatic side elevational view of an imaging or image setting unit movable parallel to the printing-form cylinder, together with RIP (raster image processor) communication with the imaging unit.

Figure 3:
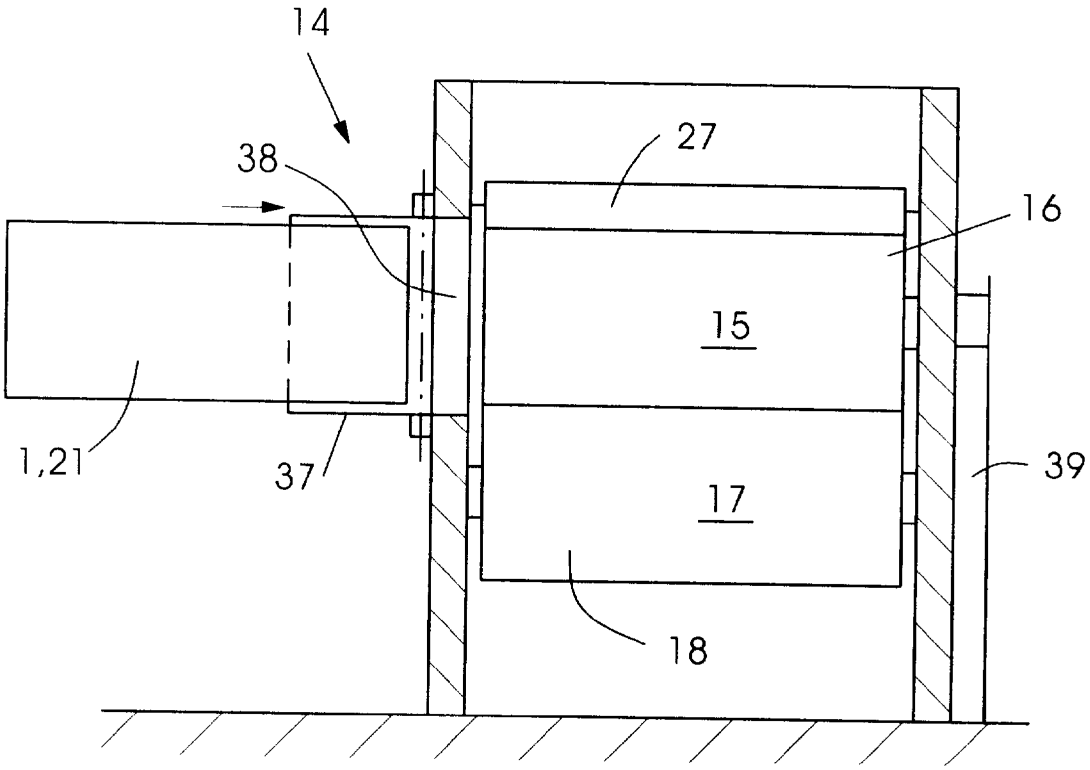
FIG. 3 is a diagrammatic front elevational view of a different embodiment of the printing form whereon an image can be set, this different embodiment being a sleeve-shaped, process-free printing form.

In the views according to FIGS. 1*a* to 1*c*, an imaging or image setting process applied to a process-free printing form is thus illustrated diagrammatically.

DESCRIPTION OF THE PREFERRED EMBODIMENTS

Referring now more specifically to the drawings, there is shown in FIG. 1*a* a process-free printing form 1 formed of a continuous coating 2 applied to a coating substrate 3, for example, fabricated from aluminum. When, in the following text, a process-free printing form 1 is referred to, this is to be understood to mean a thermal printing form whereon an image can be set and which can be used in the CTP or computer-to-press process without any interposition after the expiration of the development operations and while excluding chemical conversion operations.

FIG. 1*b* shows, in an enlarged view, the application of radiation to a dry area of a process-free printing form.

Laser radiation 4 emitted by an imaging or image setting unit 22 (note FIG. 2) strikes the surface 2 of the process-free printing form 1 in the radiation area 5 and has the effect that edges 7 of dots are formed between the irradiated area 5 and non-irradiated coating material 8. The material of the coating 2 located in the radiation area 5 reacts, forming dividing edges from adjacent non-irradiated material of the closed coating area 2 above the coating substrate 3, which is preferably formed of aluminum.

FIG. 1*c* illustrates the coating substrate 3 whereon a printing dot area 6 has now been formed.

The enlarged illustration of the printing dot area 6 shows that the non-irradiated coating material 8 surrounding the radiation area 5, according to FIG. 1*b*, has been washed out. As a result, on both sides of the flanks 13 of the printing dot 12, exposed dampening-solution carrying zones 9 have been formed. The surface 6 of the printing dot 12 constitutes the printing dot area which, in the printing nip, transfers the ink to the surface of the respectively opposed transfer cylinder 17 by ink splitting.

FIG. 2 is a side elevational view of an imaging or image setting unit, which is movable parallel to the printing-form cylinder, together with an RIP interacting or cooperating with imaging unit.

FIG. 2 shows a heat source 23, an irradiation area 24 and a displacement range in the circumferential direction 34.

Accommodated in a printing unit 14 is a printing-form cylinder 15, on the circumferential surface 16 of which a printing form 21 whereon an image can be set directly is accommodated. In the embodiment shown in FIG. 2, the printing form 21 whereon an image can be set directly is plate-shaped, and the clamping edges 21.3 are accommodated in clamping devices (not specifically illustrated) on the peripheral face 16 of the printing-form cylinder 15. The printing form 21 includes a coating substrate 21.2, whereon there is a coating 21.1 whereon an image is set and exposed, respectively, by the imaging unit 22 which is movable in the axial direction.

Furthermore, the printing-form cylinder 15, which rotates about a rotational axis 19, has a number of ink applicator rollers 26, 27, 28 and 29 assigned thereto, which are inked via an inking unit 25 not specifically illustrated here. Also located in the printing unit 14 is a dampening unit 30. The dampening unit 30 has a dampening-solution applicator roller 31 which, via a mechanism which is not specifically illustrated here, can be set onto the surface of the printing form 21. The dampening-solution applicator roller 31 applies the dampening solution, conveyed from a dampening-solution container 33 via a metering dip roller 32, to the surface of the printing form 21.

Arranged opposite the printing-form cylinder 15 is a transfer cylinder 17, to the peripheral surface 18 of which there is applied a cover in the form of an endless rubber blanket or a rubber-blanket sleeve. The cover fitted to the peripheral surface 18 transfers the printing image from the surface of the image-set printing form 21 to the printing material.

The printing-form cylinder 15, together with the printing form 21 fitted to the peripheral surface 16 thereof, has an imaging or image setting unit 22, for example, in the form of a laser, assigned thereto. The imaging or image setting unit 22 is connected via a data bus to a raster image processor 35 (RIP) which contains a bitmap 36 of the printing image to be applied to the coating 21.1, respectively, depending upon the print job to be performed. The bitmap 36 contains the control data for the imaging or image setting unit 22 and, by moving in the axial direction perpendicularly to the plane of the drawing of FIG. 2, produces an image pattern on the coating 21.1 on the printing form 21.

The radiation emitted by the imaging or image setting unit 22 produces, on the coating 21.1, elevated, projecting printing areas 6 (note FIG. 1*c*) and dampening-solution carrying areas 10, 11 (note FIG. 1*c*), wherein the printing form 21 does not pick up any ink. The action of setting an image on the printing form 21, i.e., imaging, is performed during a pass of the imaging or image setting unit 22 parallel to the rotational axis 19 of the printing-form cylinder 15, in accordance with the predefinition of the bitmap 36. According to the process of the invention, the return pass of the imaging or image setting unit 22 into the respective starting position thereof is utilized for stabilizing the image-set surface 21.1 of the printing form 21 by curing. The power needed for the curing, for stabilizing the image-set surface of the printing form 21, which has to be applied by the imaging or image setting unit 22 during the return pass, does not necessarily correspond to the power needed to set an image on the printing form 21, but can be lower.

During the return pass thereof into the initial or starting position thereof, the imaging or image setting unit 22 is operated with power which is just adequate to cure the image-set surface 21.1 applied over the entire area of the printing form 21; this leads to the ink-accepting layer 6 being “burned in”, and curing. In addition, the ink-accepting layer produced in the imaging or image setting pass can have an image set thereon again in a second pass during the return pass of the imaging or image setting unit 22 with an adapted power of the imaging or image setting unit 22, corresponding to the control data laid down in the bitmap 36 in the RIP 35, also referred to as “curing by imaging”. The second imaging or 10 image setting operation performed in accordance with the control data laid down in the bitmap 36 may be necessary in the case of printing forms when the ink-accepting area 6 of the coating 21.1 on the printing form 21 has been produced during the course of direct imaging or image setting, and the locations not exposed or on which no image has been set by the imaging or image setting unit 22 have been washed out or had to be washed out, during the premoistening of the printing form 21 by the dampening unit 20 or during the inking of the printing form 21, in such a way that the locations form the dampening-solution carrying layers. In this case, during the return pass of the imaging or image setting unit parallel to the rotational axis 19 of the printing-form cylinder 15, the image pattern produced in the first imaging or image setting step can, so to speak, be redrawn in a second imaging or image setting step.

The reduced power of the imaging or image setting unit 22 required for curing the image-set printing form 21 can be set freely within the context of the presetting of the image setting parameters, depending upon the make of the printing form 21 or upon the manufacturer of the printing form 21. If use is made of printing forms 21 having an image setting with a high energy requirement, it is then possible (likewise within the context of the presetting of the image setting parameters on a digital printing machine) for presetting of the maximum speed of the printing-form cylinder 15 during the imaging or image setting operation, and presetting of the axial advance of the imaging or image setting unit 22 parallel to the rotational axis 19 of the imaging or image setting unit 22 to be performed. Limiting the maximum speed of the printing-form cylinder 15 and that of the advance of the imaging or image setting unit 22, in conjunction with the appropriate rotational speed of the plate cylinder, ensures that even a printing form 21 with a high energy requirement for imaging or setting an image can have an image set thereon reliably.

In a method which also uses the basic concept of the invention, provision is made for activating the printing form 21 after the imaging or image setting operation by setting on the dampening-solution applicator roller 31 of the dampening unit 30 and for delimiting the non-printing areas 10, 11 (note FIG. 1*c*), the later water-accepting or water-friendly areas, from the printing locations 6. This is then followed by a second exposure operation, which, so to speak, redraws the image pattern of which the image has previously already been set, for which purpose one pass of the imaging or image setting unit 22 with adapted power, controlled by the bitmap 36 stored in the RIP 35, can be performed. The second imaging or image setting pass constitutes dual imaging or image setting of a printing form 21, by which curing of the surface 21.1 of the printing form 21 may be achieved. The imaging or image setting phase according to this modified variation of the proposed method according to the invention may be subdivided into a first imaging or image setting phase and a further imaging or image setting phase. In the first-mentioned phase, the image can be set on the printing form 21 by an imaging or image setting unit which is operated with increased power, while the subsequent imaging or image setting operation during the return pass is performed with reduced power by the imaging or image setting unit 22 in order to cure the image pattern produced on the surface 21.1 of the printing form 21.

According to this procedure, the setting of an image on the bitmap 36 is not necessarily performed a second time; the setting of an image or curing is not required in the non-printing locations, and these are comparatively non-critical.

FIG. 3 shows a printing unit 14, illustrated in very diagrammatic form, of a directly imaging or image-setting, digital rotary printing machine.

Via a pivoted-open gate 37, an opening 38 in a side wall of the printing unit is exposed, through which opening the process-free printing form 21, formed as an endless, sleeve-shaped structure, can be pushed in the direction of the associated arrow onto the peripheral surface 16 of the printing-form cylinder 15. For this purpose, the applicator rollers, of which the applicator roller 27 of the inking unit 25 is illustrated by way of example here, are separated from the peripheral surface 16 of the printing-form cylinder 15; this is also true for the transfer cylinder 17 arranged underneath the printing-form cylinder 15. Illustrated in diagrammatic form on the opposite side wall is a holding arm 39, which supports the printing-form cylinder 15 while a sleeve-like printing form 21 is being changed.

I claim:

1. A method of treating a process-free printing form fitted to a printing-form cylinder, which comprises having an imaging unit act upon a coating of a printing form and produce printing areas and non-printing areas on the printing form, and after the imaging unit has acted upon the coating, operating the imaging unit at reduced power during a return pass into a starting position thereof.

2. The method according to claim 1, wherein the reduced power corresponds to the power just needed for fixing the part of the coating whereon the printing areas are produced.

3. The method according to claim 1, which includes, during the return pass of the imaging unit, performing renewed imaging on the coating of the printing form in accordance with a bitmap of a raster image processor.

4. The method according to claim 1, which includes preselecting the power of the imaging unit for the respective return pass depending upon the printing form fitted to the printing-form cylinder.

5. The method according to claim 1, which includes limiting the maximum speed of the imaging unit during the return pass thereof, when the printing form demands a high power level of the imaging unit.

6. The method according to claim 1, which includes limiting the stroke of the imaging unit during the return pass of the imaging unit, when the printing form demands a high power level of the imaging unit.

7. The method according to claim 1, which includes, washing out the printing form between imaging operations in a forward pass and the return pass, during the return pass setting an image on the printing form by the imaging unit over the entire area of the printing form, depending upon the layer structure of the printing form.

8. The method according to claim 1, which includes, washing out the printing form between the return pass of the imaging unit and a second imaging pass, during the second imaging pass setting an image on the printing form by the imaging unit over the entire area of the printing form, depending upon the layer structure of the printing form.

* * * * *